United States Patent
McSwiney et al.

(10) Patent No.: US 7,125,582 B2
(45) Date of Patent: Oct. 24, 2006

(54) LOW-TEMPERATURE SILICON NITRIDE DEPOSITION

(75) Inventors: Michael L. McSwiney, Hillsboro, OR (US); Michael D. Goodner, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 438 days.

(21) Appl. No.: 10/631,627

(22) Filed: Jul. 30, 2003

(65) Prior Publication Data

US 2005/0025885 A1     Feb. 3, 2005

(51) Int. Cl.
*C23C 16/00* (2006.01)
(52) U.S. Cl. .............. 427/255.27; 427/255.26; 427/255.23; 427/248.1; 427/255.394; 427/255.393
(58) Field of Classification Search ......... 427/255.393, 427/255.394, 255.27, 255.26, 255.23, 248.1
See application file for complete search history.

(56) References Cited

U.S. PATENT DOCUMENTS 6,277,200 B1 * 8/2001 Xia et al. .................. 118/697

* cited by examiner

*Primary Examiner*—Timothy Meeks
*Assistant Examiner*—Howard Abramowitz
(74) *Attorney, Agent, or Firm*—Blakely, Sokoloff, Taylor & Zafman LLP

(57) ABSTRACT

A method including combining a silicon source precursor and a nitrogen source precursor at a temperature up to 550° C.; and forming a silicon nitride film. A system including a chamber; a silicon precursor source coupled to the chamber; a controller configured to control the introduction into the chamber of a silicon precursor from the silicon precursor source; and a memory coupled to the controller comprising a machine-readable medium having a machine-readable program embodied therein for directing operation of the system, the machine-readable program including instructions for controlling the second precursor source to introduce an effective amount of silicon precursor into the chamber at a temperature up to 550° C.

6 Claims, 4 Drawing Sheets

LOW-TEMPERATURE SILICON NITRIDE DEPOSITION

BACKGROUND

1. Field

Film formation.

2. Background

As process generations move forward, the sensitivity of circuit devices to higher fabrication temperatures increases. For example, the sensitivity of transistor components such as tips, wells, and implants to higher temperatures increases as these components become smaller and shallower. Higher temperatures cause implants, for example, to diffuse and adversely affect the implant and thus device performance.

Dielectric films are used in a number of instances in circuit fabrication. Silicon nitride is a common dielectric film that is typically formed by combining a silicon source precursor (e.g., a vapor) with a nitrogen source precursor (e.g., a vapor) in a deposition chamber. One current silicon source precursor is bis(tert-butyl amino) silane. When combined with a nitrogen source precursor such as ammonium ($NH_3$), the reaction conditions to form a silicon nitride film generally require a temperature greater than 550° C. Such a chamber temperature can affect temperature sensitive devices as noted above and it is anticipated that the effect will be more pronounced as generations move forward.

BRIEF DESCRIPTION OF THE DRAWINGS

Features, aspects, and advantages of embodiments will become more thoroughly apparent from the following detailed description, appended claims, and accompanying drawings in which:

DETAILED DESCRIPTION

Silicon nitride films are useful in circuit fabrication processes as dielectric films and etch stop and hard mask layers. To form a silicon nitride film, a silicon source precursor and a nitrogen source precursor are combined in a deposition chamber or tool. The silicon nitride films described herein can be carried out in various tools. Suitable tools include, but are not limited to, a vertical diffusion furnace (VDF), a chemical vapor deposition (CVD) chamber, a plasma enhanced chemical vapor deposition (PECVD) chamber, and an atomic layer deposition (ALD) chamber.

Figure 1:
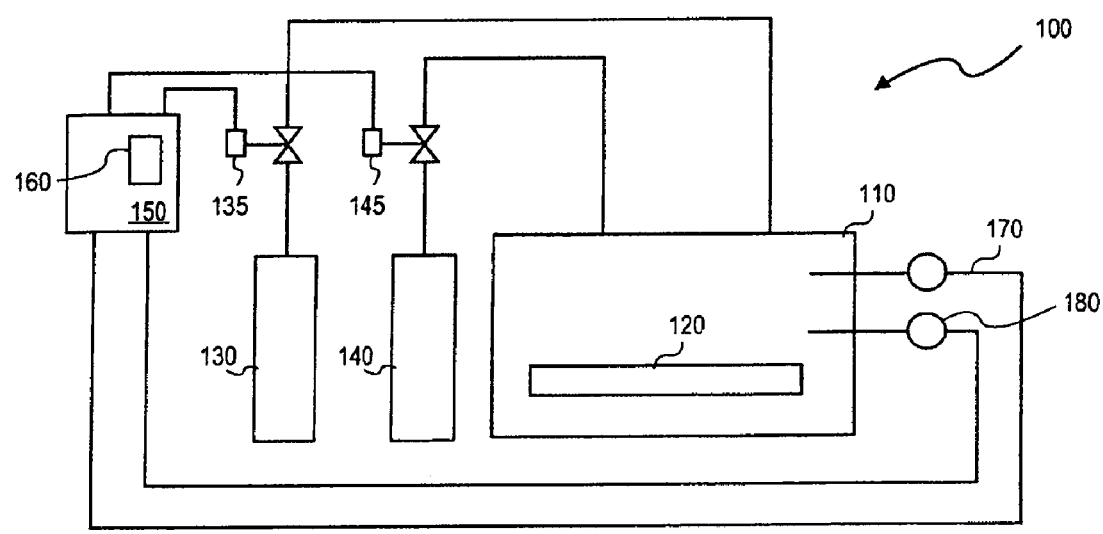
FIG. 1 shows a schematic of a deposition chamber.

FIG. 1 shows a schematic of a system suitable for forming a silicon nitride film. System 100 includes chamber 110 that is, for example, a VDF, CVD, PECVD, or an ALD chamber. Situated in chamber 110 is one or more substrates 120 located in chamber 110 for a film formation process. Connected to chamber 110 are silicon source precursor 130 and nitrogen source precursor 140. Additional precursor sources may be connected to chamber 110 as well, such as precursor sources for additional species or inerts. Transportation of the precursor (which may be a solid, liquid, or gas) to the deposition chamber may be accomplished through numerous methods including, but not limited to, bubbling, vapor draw, and direct liquid injection. The entry of, in this instance, a silicon source precursor or a nitrogen source precursor is controlled by valve 135 and valve 145, respectively, that are each connected to controller 150. Controller 150 includes memory 160 that has therein instructions for introduction of silicon source precursor 130 and nitrogen source precursor 140. Those instructions include, in one embodiment, the introduction to form a silicon nitride film. Also connected to chamber 110 and controlled by controller 150 is a heat source to elevate an operating temperature of the chamber. FIG. 1 further shows temperature sensor 170 that is connected to controller 150 and may be used by controller 150 to control a temperature inside chamber 110. In embodiments described herein, a silicon nitride film formation process may be conducted at a temperature of 550° C. or less. Thus, instructions, for example, in memory 160 may maintain the temperature in chamber 110 at 550° C. or less for a silicon nitride film formation process. Finally, system 100 may also include a pressure sensor connected to controller 150 to monitor pressure inside chamber 110. In one example, chamber 110 may be connected to a vacuum or other pressure regulator.

Suitable nitrogen gas sources for use as precursors in silicon nitride film formation include ammonia as well as more reactive nitrogen sources, such as hydrazine ($N_2H_4$), and substituted hydrazine (e.g., t-butyl hydrazine, cis-dimethyl hydrazine, and 1,1-dimethyl hydrazine).

In one embodiment, a suitable silicon source for use as a precursor in silicon nitride film formation is one that allows a deposition temperature to be reduced to 550° C. or below 550° C. Suitable silicon source precursors include aminosilanes, particularly aminosilanes with at least one diamine ligand (one ligand bound twice to the silicon) or halogenated aminosilanes. Suitable other silicon source precursors include silazanes, silyl hydrocarbons, and azidosilanes. Although the noted silicon source precursors may be used to form a silicon nitride film at temperatures of 550° C. or less, they may also be used in instances where the temperature is greater than 550° C.

One suitable family of compounds is partially and fully substituted aminosilanes with at least one diamine ligand. In one embodiment, the aminosilane has a general formula:

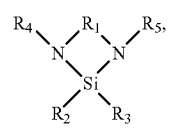

where $R_1$ is a saturated or unsaturated hydrocarbon chain comprising one or more carbon atoms, (e.g., $(CH_2)_n$ where n is an integer one or greater, or $C_2H_2$), where each of $R_2$ and $R_3$ is selected from a hydrogen, a halogen, and a saturated or unsaturated hydrocarbon moiety, and where each of $R_4$ and $R_5$ is selected from a saturated or unsaturated hydrocarbon.

In another embodiment, suitable aminosilanes have the general formula:

Si(NRC$_x$H$_y$NR)$_a$H$_{4-2a}$, where R is selected from a hydrogen and a saturated or unsaturated hydrocarbon moiety,
where x is an integer greater than or equal to one,
where y is an integer greater than or equal to two, and
where a is one or two.

Figure 2:
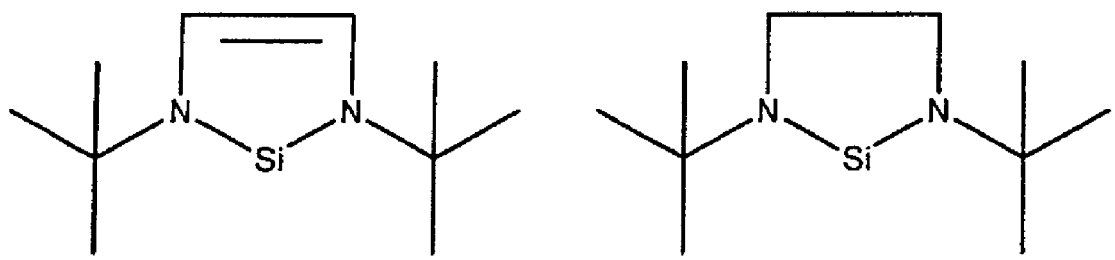
FIG. 2 shows embodiments of aminosilanes with diamene ligands.
Figure 3:
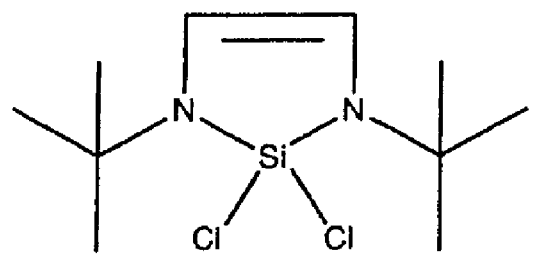
FIG. 3 shows an embodiment of a halogenated aminosilane with a diamene ligand.

FIG. 2 shows representative aminosilanes with diamene ligands. Example compounds presented in this family include 1,3-di-tert-butyl-1,3-diaza-2-silacyclopent-4-en-2-ylidene and 1,3-di-tert-butyl-1,3-diaza-2-silacyclopent-2-ylidene. FIG. 3 shows an example of a chlorine substituted variant of an aminosilane with a diamene ligand. FIG. 3 representatively shows 1,3-di-tert-butyl-2,2-dichloro-1,3-diaza-2-silacyclopent-4-ene.

Another group of compounds useful as a silicon source precursor for silicon nitride deposition is halogenated aminosilanes. In one embodiment, the halogenated aminosilanes have the general formula:

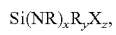
Si(NR)$_x$R$_y$X$_z$, where X is a halogen such as fluorine, chlorine, bromine, or iodine,
where x is an integer greater than or equal to one,
where y is an integer greater than or equal to zero,
where z is an integer greater than or equal to one, and
where the sum of x, y, and z is four.

Figure 4:
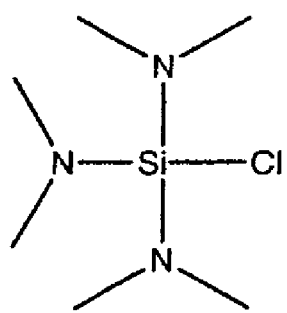
FIG. 4 shows an embodiment of a halogenated aminosilane.

FIG. 4 shows one example of a halogenated silane (tris (dimethylamino) chlorosilane). Other variations may be formed through substitution of the amine with a diamine ligand and substitution of the halogen on the amine or alkyl ligands. It is known that the halogen tends to pull electron density from the silicon and thus may therefore weaken Si—N bonds.

Figure 5:
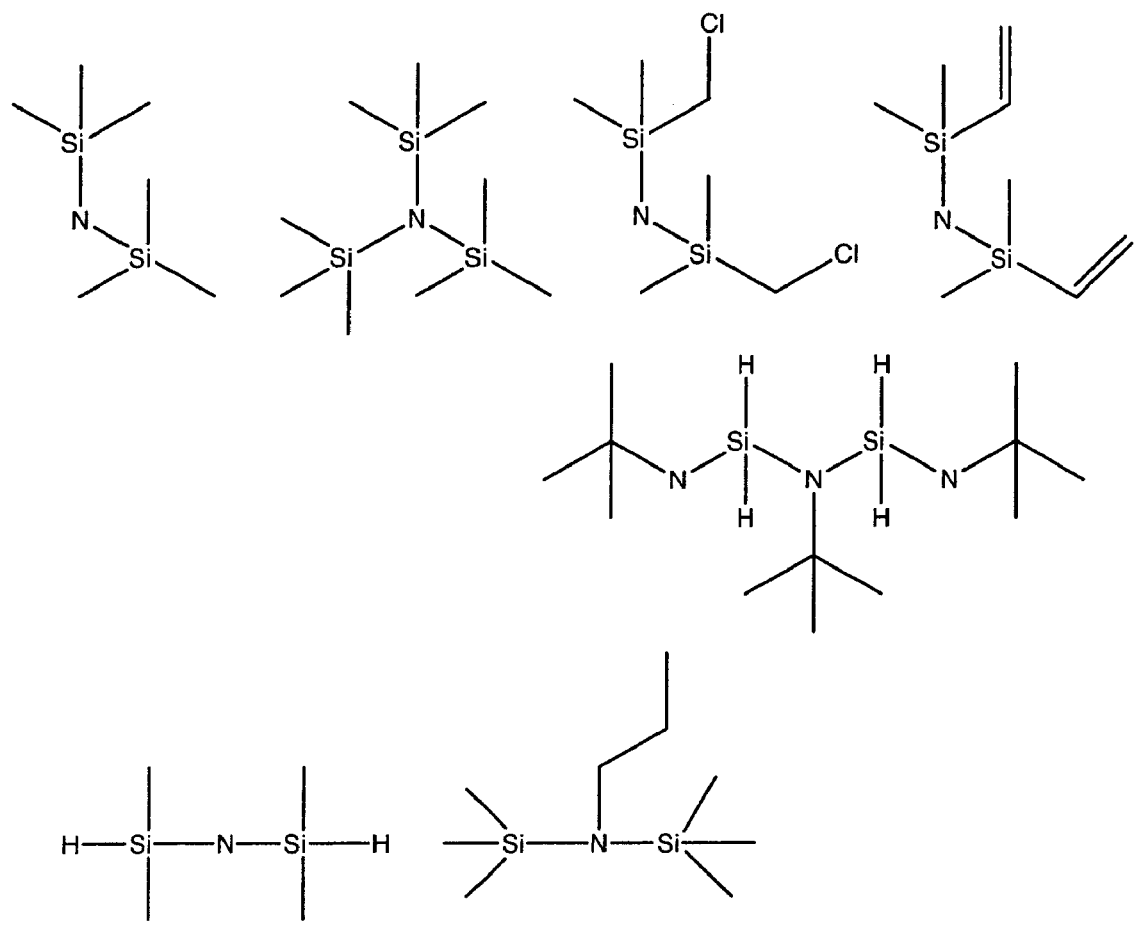
FIG. 5 shows embodiments of linear and branched silazanes.
Figure 6:
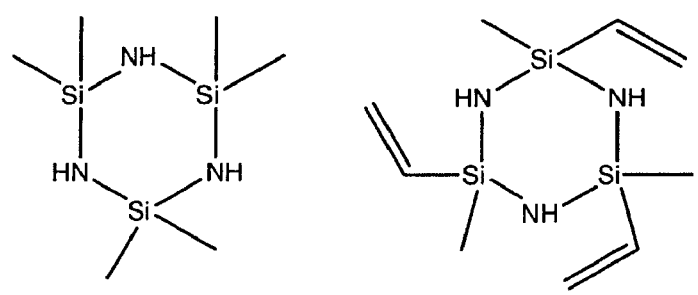
FIG. 6 shows embodiments of cyclic silazanes.

Another group of compounds useful as a silicon source precursor for a silicon nitride deposition is silazanes. A representation of suitable silazanes is shown in FIG. 5. FIG. 5 shows linear and branched silazanes where silicon atoms are bridged by nitrogen and have the general formula:

NR$_x$(SiX$_a$R$_{3-a}$)$_{3-x}$, where R is a saturated or unsaturated hydrocarbon, or a substituted or unsubstituted amine,
where X is a is a halogen such as fluorine, chlorine, bromine, or iodine,
where x is an integer equal to zero or one, and
where a is an integer equal to or greater than zero One group of suitable linear and branched silazanes include, but are not limited to, 1,1,1,3,3,3-hexamethyldisilazane, tri(trimethylsilyl) amine, 1,3-bis(chloromethyl)-1,1,3,3-tetramethyldisilazane, 1,3-divinyl-1,1,3,3-tetramethyldisilazane, 1,3-bis(tert-butylamino)-2-tert-butyldisilazane, 1,1,3,3-tetramethyldisilazane, and 1,1,3,3,3-hexamethyl-2-propyldisilazane. FIG. 6 shows cyclic silazanes in which the silicon and nitrogen atoms form a ring structure. This group of compounds includes, but is not limited to, 2,2,4,4,6,6-hexamethylcyclotrisilazane, and 2,4,6-trimethyl-2,4,6-trivinyl-cyclotrisilazane.

Another group of compounds that is suitable as a silicon source precursor for silicon nitride deposition includes compounds in which silicon atoms are bridged by hydrocarbon fragments. Hydrocarbon bridged silicon compounds include silyl moieties, particularly saturated or unsaturated silyl alkyls. Suitable silyl alkyls have the general formula:

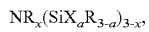
CR$_x$(SiX$_a$R$_{3-a}$)$_{4-x}$ or

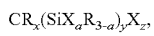
CR$_x$(SiX$_a$R$_{3-a}$)$_y$X$_z$, where X is a halogen such as fluorine, chlorine, bromine, or iodine,
where R is a saturated or unsaturated hydrocarbon, or a substituted or unsubstituted amine,
where a is an integer of zero to three,
where x is an integer of zero to three,
where y is an integer greater than or equal to one, and
where z is an integer greater than or equal to one.

Figure 7:
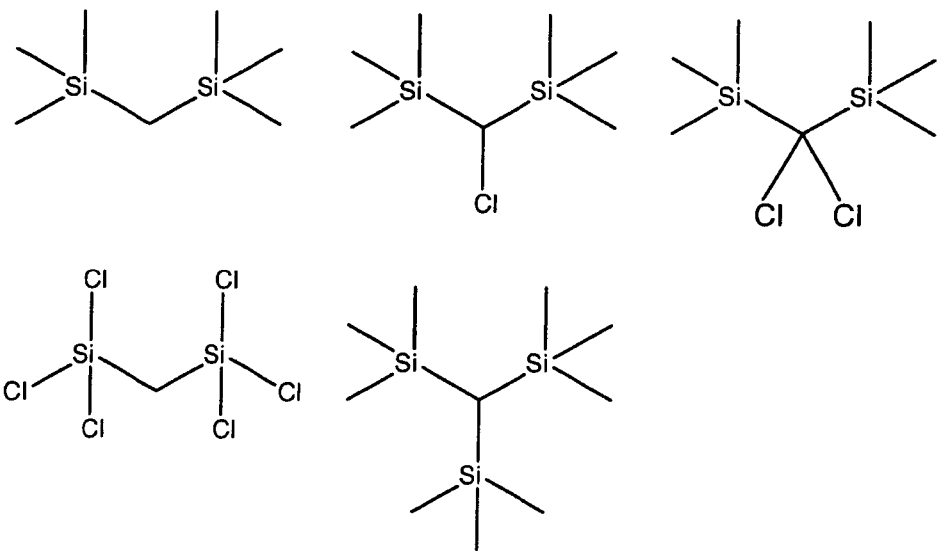
FIG. 7 shows embodiments of silyl alkyls (silyl methanes).
Figure 8:
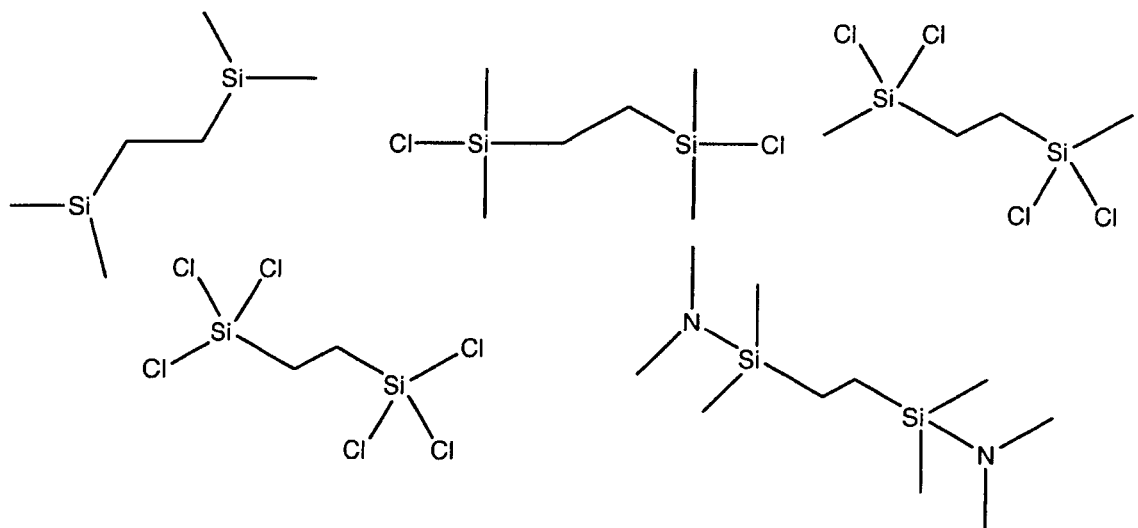
FIG. 8 shows embodiments of silyl alkyls (silyl ethanes).

FIG. 7 shows suitable silyl alkyls (silyl methanes). These compounds include, but are not limited to, bis(trimethylsilyl) methane, chloro-bis(trimethylsilyl) methane, dichloro-bis(trimethylsilyl) methane, bis(trichlorosilyl) methane, and tris(trimethylsilyl) methane. FIG. 8 shows other suitable silyl alkyls (silyl ethanes). The compounds include, but are not limited to, 1,2-bis(dimethylsilyl) ethane, 1,2-bis(chlorodimethylsilyl) ethane, 1,2-bis(dichloro(methyl)silyl) ethane, 1,2-bis(trichlorosilyl) ethane, and 1,2-bis[(dimethylamino)dimethylsilyl] ethane.

Figure 9:
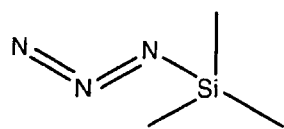
FIG. 9 shows an embodiment of an azidosilane.

Still another suitable group of compounds that are suitable as a silicon source precursor for a silicon nitride deposition are azidosilanes. Azidosilanes include one or more azide ligands (N$_3$) bound to a silicon (silane, disilane, or some variation as detailed in the chemical families noted in previous embodiments). One example of azidosilane is trimethylazidosilane shown in FIG. 9.

Among the embodiments of silicon source precursors referenced above, features that may facilitate a lower silicon nitride formation temperature (e.g., less than 550° C.) include increased bond strain and increased functional group reactivity. Representatively, increased bond strain is seen in cyclized precursors, as four- and five-membered rings (and to some extent, six-membered rings) tend to have increased reactivity due to the deviation from, for example, an energetically preferred six- to eight-membered ring systems. Increased functional group reactivity is also demonstrated by halosilane and aziosilane derivatives, as the halogen and azide moieties tend to have increased reactivity compared to alkyl groups.

In the preceding paragraphs, specific embodiments are described. It will, however, be evident that various modifications and changes may be made thereto without departing from the broader spirit and scope of the claims. The specification and drawings are, accordingly, to be regarded in an illustrative rather than a restrictive sense.

What is claimed is:

1. A method comprising:
combining a specific silicon source precursor and a nitrogen source precursor at a temperature up to 550° C.; and
forming a silicon nitride film, wherein the silicon source precursor has one of the general formula:

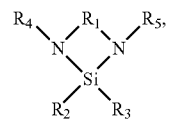

where R$_1$ is a saturated or unsaturated hydrocarbon chain comprising one or more carbon atoms,
where each of R$_2$ and R$_3$ is selected from a hydrogen, a halogen, and a saturated or unsaturated hydrocarbon moiety;

where each of $R_4$ and $R_5$ is selected from a saturated or unsaturated hydrocarbon; and the general formula:

where R is selected from a H and a saturated or unsaturated hydrocarbon moiety, where x is an integer greater than or equal to one, where y is an integer greater than or equal to two, and where a is one or two.

2. The method of claim 1, wherein the nitrogen source precursor comprises ammonia, a substituted hydrazine, or an unsubstituted hydrazine.

3. A method comprising:

combining a silicon source precursor and a nitrogen source precursor; and forming a silicon nitride film, wherein the silicon source precursor is selected from one of the general formula:

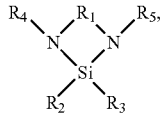

where $R_1$ is a saturated or unsaturated hydrocarbon chain comprising one or more carbon atoms, where each of $R_2$ and $R_3$ is selected from a hydrogen, a halogen, and a saturated or unsaturated hydrocarbon moiety, and where each of $R_4$ and $R_5$ is selected from a saturated or unsaturated hydrocarbon, and the general formula:

where R is selected from a H and a saturated or unsaturated hydrocarbon moiety, where x is an integer greater than one or equal to one, where y is an integer greater than or equal to two, and where a is one or two.

4. The method of claim 3, wherein the nitrogen source precursor comprises ammonia, a substituted hydrazine, or an unsubstituted hydrazine.

5. A method comprising:

combining a aminosilane source precursor and a nitrogen source precursor in a deposition chamber, wherein the aminosilane source precursor comprises a material having a property that will, in combination with the nitrogen source precursor, form a silicon nitride film at a temperature up to 550° C; and forming a silicon nitride film, wherein the aminosilane is selected from one of the general formula:

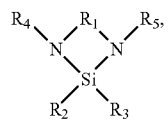

where $R_1$ is a saturated or unsaturated hydrocarbon chain comprising one or more carbon atoms, where each of $R_2$ and $R_3$ is selected from a H, a halogen, and a saturated or unsaturated hydrocarbon moiety, and where each of $R_4$ and $R_5$ is selected from a saturated or unsaturated hydrocarbon, and the general formula:

where R is selected from a H and a saturated or unsaturated hydrocarbon moiety, where x is an integer greater than or equal to one, where y is an integer greater than or equal to two, and where a is one or two.

6. The method of claim 5, wherein the nitrogen source precursor comprises ammonia, a substituted hydrazine, or an unsubstituted hydrazine.

* * * * *